United States Patent [19]

Berkman et al.

[11] 4,216,186

[45] Aug. 5, 1980

[54] MEANS FOR GROWING RIBBON CRYSTALS WITHOUT SUBJECTING THE CRYSTALS TO THERMAL SHOCK-INDUCED STRAINS

[76] Inventors: Robert A. Frosch, Administrator of the National Aeronautics and Space Administration, with respect to an invention of Samuel Berkman, Florham Park, N.J.; Kyong-Min Kim, E. Windsor, N.J.; Harold E. Temple, Trenton, N.J.

[21] Appl. No.: 938,579

[22] Filed: Aug. 31, 1978

[51] Int. Cl.² .............................................. B01J 17/18
[52] U.S. Cl. .......................... 422/246; 156/DIG. 96
[58] Field of Search ............... 422/246, 249; 156/608, 156/619, DIG. 96; 65/326, 327

[56] References Cited

U.S. PATENT DOCUMENTS

| | | | |
|---|---|---|---|
| 1,469,379 | 10/1923 | Callard | 156/DIG. 96 |
| 3,124,489 | 3/1964 | Vogel, Jr. et al. | 156/608 |
| 3,197,297 | 7/1965 | Miller | 65/326 |
| 3,198,615 | 8/1965 | Stalego | 65/327 |
| 3,582,528 | 6/1971 | Seale et al. | 156/DIG. 96 |
| 3,726,655 | 4/1973 | Mitcham et al. | 65/327 |
| 4,157,373 | 6/1979 | Berkman et al. | 422/246 |

FOREIGN PATENT DOCUMENTS

5221993   6/1977   Japan ........................... 159/DIG. 96

Primary Examiner—Hiram H. Bernstein
Attorney, Agent, or Firm—Monte F. Mott; John R. Manning; Wilfred Grifka

[57] ABSTRACT

In combination with a susceptor particularly suited for use in growing a ribbon crystal employing edge-defined film-fed growth techniques and characterized by a susceptor including a die through which a melt is drawn for forming a crystal ribbon, a pair of jets for directing a stream of fluid coolant along a path extended to impinge on the susceptor in close proximity with the die in non-incident relation with the crystal being grown.

3 Claims, 4 Drawing Figures

MEANS FOR GROWING RIBBON CRYSTALS WITHOUT SUBJECTING THE CRYSTALS TO THERMAL SHOCK-INDUCED STRAINS

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

The invention generally relates to an apparatus employed in the production of ribbon-shaped crystals and more particularly to an improved susceptor having jets for directing streams of fluid coolant in close proximity and non-incident relation with a crystal being grown for stabilizing crystal growth without inducing strain resulting from thermal shock.

2. Description of the Prior Art

The prior art is, of course, complete with devices adapted to be employed in the production of ribbon-shaped crystals from crystal melts employing susceptors having openings defined therein through which a melt is pulled for forming a ribbonshaped crystal.

One known process for producing silicon ribbon employs a V-shaped longitudinal trough comprising a susceptor having an inner wall for confining silicon melt. A die comprising longitudinal slit is provided at the lower edge or apex of the V-trough through which a thin ribbon is pulled. Moreover, it should be appreciated that it also is well known that growth stabilization of a crystal may be achieved through a use of jets for directing streams of fluid coolant to cool crystals as they are grown by techniques sometimes referred to as edge-defined film-fed growth processes.

However, it is important to note that thermal and strain analysis of ribbon-shaped crystals, grown by edge-defined film-fed growth processes, tend to exhibit excessive strain due to the effects of thermal shock. Of course, crystals exhibiting excessive strain tend to be excessively frangible and, consequently, may be found unsuitable for use in environments wherein the crystal is subjected to excessive mechanically induced shock.

It is therefore a purpose of the instant invention to provided an improved method and device for use in stabilizing the growth of a crystal grown by edge-defined film-fed growth techniques without subjecting the resulting crystal to strain inducing effects of thermal shock.

OBJECTS AND SUMMARY OF THE INVENTION

It is an object of the invention to provide in a method for growing ribbon-shaped crystals from silicon melt the step of stabilizing the growth of the crystal without inducing strain due to the effects of thermal shock.

It is another object to provide in combination with a susceptor particularly suited for use in growing a crystal employing the edge-defined film-fed growth technique jets for delivering streams of fluid coolant to impinge on the susceptor in close proximity and in non-incident relation with the ribbon crystal being formed.

These and other objects and advantages are achieved by combining with a susceptor of a V-trough configuration having a die extended along the apex thereof, a pair of jets for directing streams of fluid coolant, such as argon or the like, against the susceptor in close proximity with the die and in non-incident relation with a crystal ribbon being formed, whereby excessive strain due to the effects of thermal stock is avoided and stabilization of ribbon growth is achieved.

DESCRIPTION OF THE PREFERRED EMBODIMENT

Figure 1:
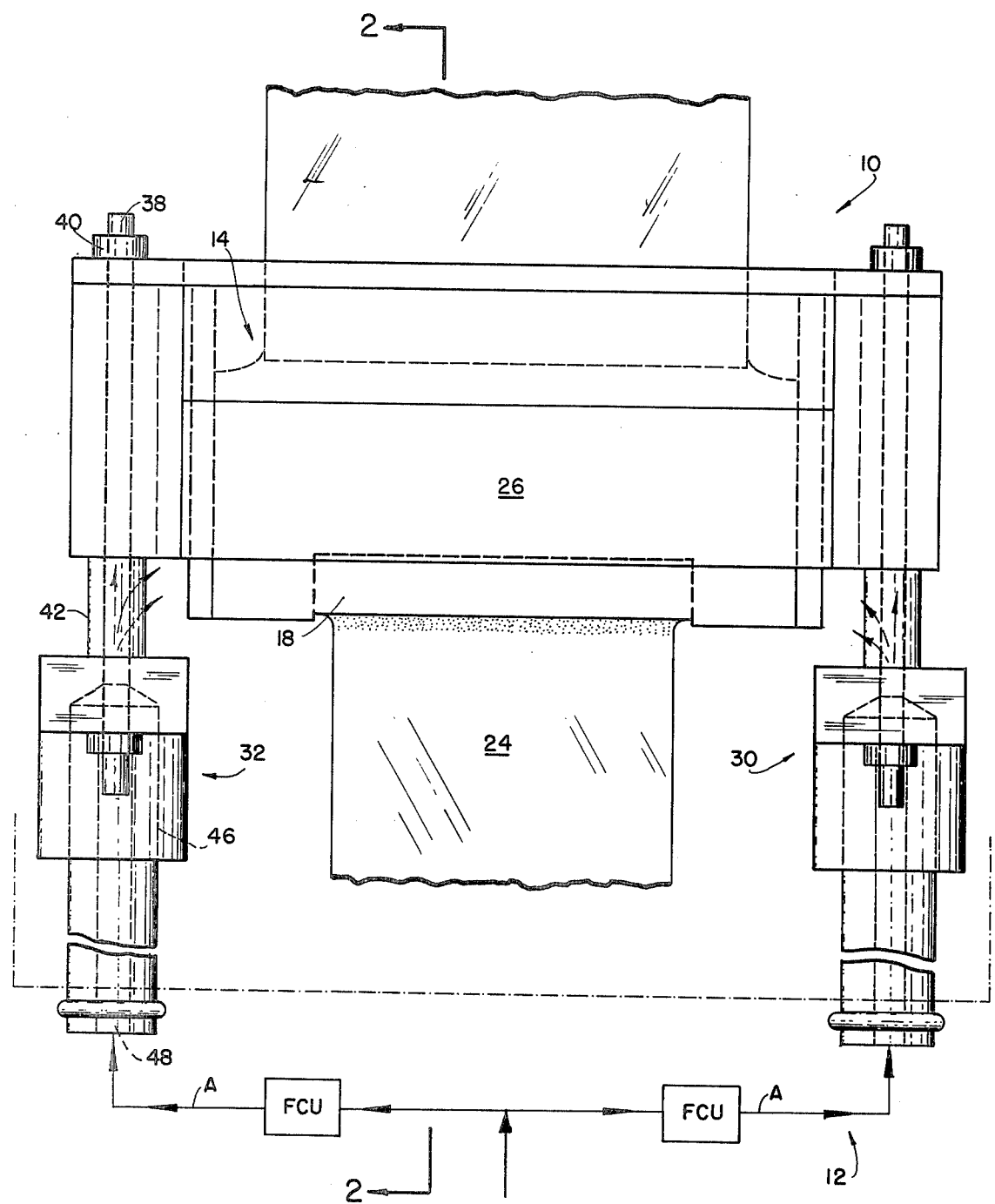
FIG. 1 is a fragmented, side elevational view, partially in block diagram form, illustrating a susceptor equipped with jets for delivering streams of fluid coolant for use in stabilizing growth for a ribbon crystal grown by an edge-defined film-fed growth technique.

Referring now to the drawings wherein like reference characters designate like or corresponding parts throughout the several views, there is shown in FIG. 1 a susceptor, generally designated 10, having connected therewith a coolant delivery system, generally designated 12, which embodies the principles of the instant invention.

The susceptor 10, generally, is of known design and comprises a V-shaped longitudinal trough 14 having a side wall 16 disposed in downwardly converging relation. Within the trough 14 there are supported converging plates 18 having defined therebetween an elongate slit, designated 20, which serves as a die through which liquid silicon melt 22 is drawn as a crystal 24 is grown employing the aforementioned edge-defined film-fed growth technique.

As a practical matter, as shown in the drawings, an insulator 26 is provided for stabilizing the temperature of the melt 22. It is important to appreciate, at this juncture, that the structure hereinbefore described comprises a device well known and understood by those familiar with the growing of ribbon-shaped crystals from silicon melt. Therefore, a more detailed discussion of the device is omitted in the interest of brevity.

However, it also is important to note that, as shown in the drawings, the susceptor 10 is supported by a pedestal generally designated 30. The pedestal is connected in supporting relation with the susceptor 10 at the opposite ends thereof. Since the pedestal 30 is symmetrical, a description of one end thereof is deemed adequate to provide for a complete understanding of the instant invention. Accordingly, reference is first made to FIG. 3 wherein there is disclosed a bar, generally designated 32, of an integral, T-shaped configuration including a transverse member 34 and an upright 36, FIG. 3.

Figures 2, 3, 4:
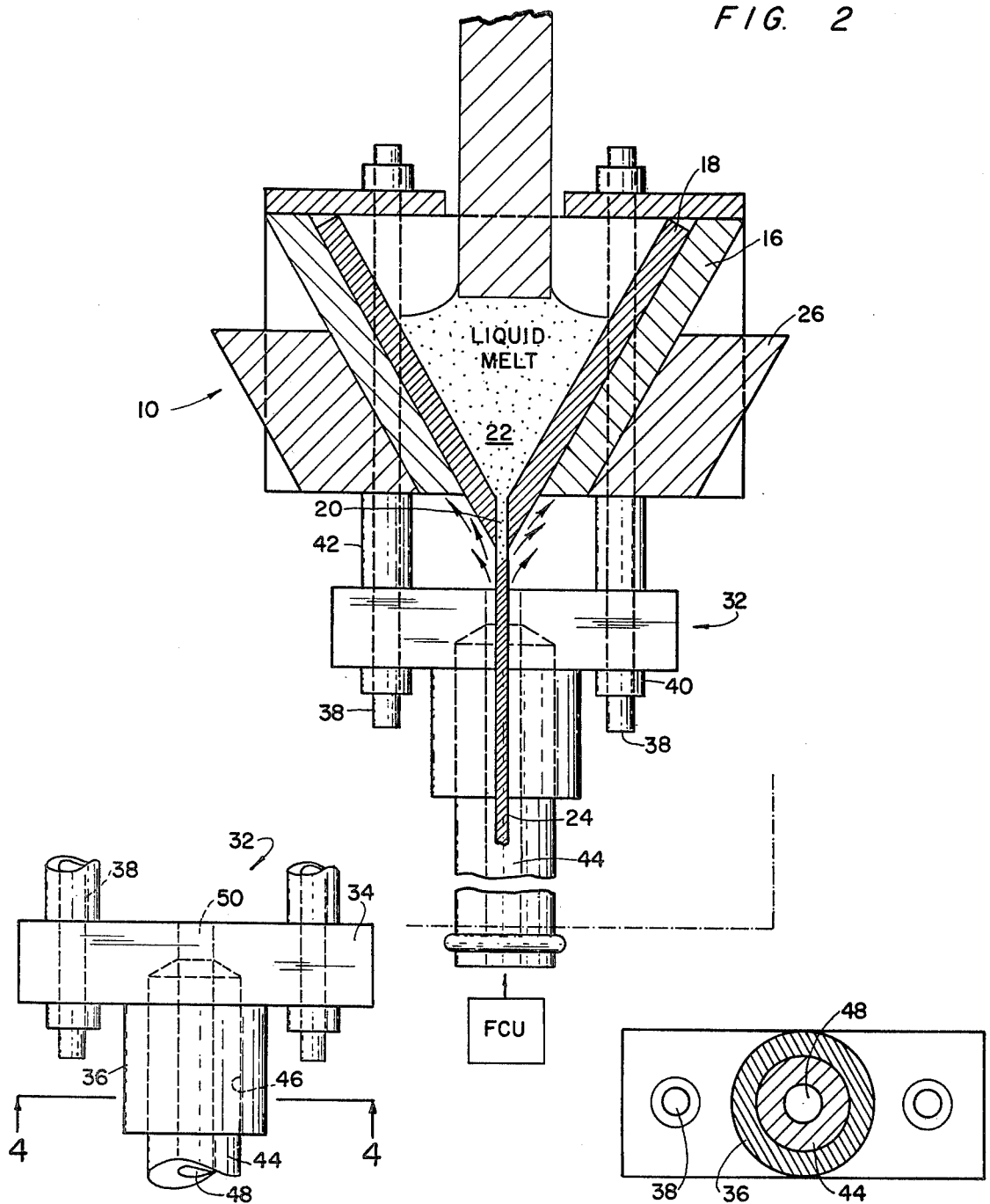
FIG. 2 is a cross-sectional view taken generally along line 2—2 of FIG. 1.
FIG. 3 is a fragmented end elevational view of a pedestal provided for supporting the susceptor as shown in FIGS. 1 and 2.
FIG. 4 is a cross-sectional view taken generally along line 4—4 of FIG. 3.

Referring now to FIGS. 1 and 2, it is important to note that the bar 32 is disposed beneath an end portion of the susceptor 10 and is connected therewith through a pair of vertically oriented pins designated 38. As a particular matter, the pins 38 are formed of graphite or similar material and are connected with the bar as well as with the susceptor employing suitable fasteners 40. Additionally, interposed between the susceptor 10 and the bar 32, in concentric relation with each of the pins 38, there is a spacer 42 also formed of graphite or similar suitable material. Thus the spacers 42 rest upon the upper surface of the bar 32 while the susceptor 10 rests upon the upper surface of the spacers 42. The pins 38, of course, serve to couple the bars, spacers and susceptor in an assembled configuration.

Each of the bars 32 is, in turn, supported by a vertically oriented post 44 having its upper end received within a bore, forming a socket 46, defined in the upright 36 of the bar 32. As a practical matter, the axis of socket 46 is normally related to the longitudinal axis of the transverse member 34 of the bar. In practice, each of the posts 44 is fabricated from a suitable material such as quartz or the like and includes a tubular bore 48 extended along the longitudinal axis thereof. This bore serves as a conduit for a fluid coolant to be employed in stabilizing the growth of a ribbon crystal as it is "pulled" from the slit 20.

In order to accommodate delivery of a fluid coolant from the bore 48, each bar 32 is provided with an orifice 50 forming a jet through which the coolant is expelled from the bores 48 to impinge against the surface of the susceptor 10. As a practical matter, the particular angle of the axis for the orifices 50 may be varied as found desirable so long as the streams do not impinge against ribbon 24. The lower end of the posts 44 is mounted in a suitable base, not shown. It is to be understood that the base is provided with a suitable fluid conduit for conducting a flow of fluid coolant along a flow path indicated by arrows A. In practice, the coolant is delivered along the conduit via a fluid control unit FCU of known design. Where desired, the flow control unit comprises a mass flow controller which automatically adjusts flow to a desired level in accordance with a selected setting. Since the flow control unit FCU comprises no specific part of the invention and such units are well known, a detailed description of the unit FCU is omitted in the interest of brevity. However, it is to be understood that, as shown, the flow control unit FCU is connected with each of the posts 44 for introducing a fluid coolant, such as argon into the bores 48. Moreover, the fluid coolant passes through the bores 48 and is delivered by the orifices 50 to impinge against the adjacent surface of the susceptor 10.

Attention is invited to FIGS. 1 and 2 wherein is illustrated a flow of fluid coolant indicated by flow arrows, not designated, directed to impinge against the surface of the susceptor in close proximity with the crystal 24 as the crystal is being grown. Thus the growth of the ribbon is, in practice, stabilized through the application of the coolant to the surface of the susceptor, without the coolant being applied directly to the crystal. As a consequence, ribbon growth stabilization is achieved with an attendant advatage that the ribbon crystal being grown is not subjected to severe thermal shock. As a consequence of the reduction in thermal shock within the ribbon crystal being grown there is an attendant reduction in excessive strain. Consequently, the ribbon crystal being grown is of increased quality.

OPERATION

It is believed that in view of the foregoing description, the operation of the device will readily be understood and it will be briefly reveiwed at this point.

With the susceptor 10 and coolant delivery system 12 assembled in the manner hereinbefore described, the system is prepared to be operated for causing a ribbon crystal 24 to be pulled from the slit 20, in a manner well understood by those familiar with edge-defined film-fed growth techniques. However, in order to effect stabilization of the growth of the crystal ribbon being growth a fluid coolant, such as argon or the like, is delivered to the bores 48 of the posts 44, via the flow control units FCU. As the fluid coolant passes through the bores of the posts 44 the coolant is permitted to be expelled under pressure from the orifices 50. Thus the orifices 50 function as jets for directing streams of fluid coolant to impinge against the surface of the susceptor 10. The streams of fluid coolant are caused to impinge the surface of the susceptor 10, in close proximity with the slit 20, without impinging against the crystal ribbon 24 being grown. Thus the crystal ribbon 24 being grown is not subjected to the thermal shock which normally attends the growth of crystal ribbons employing the techniques and devices heretofore available.

In view of the foregoing, it should readily be apparent that the method and system which embodies the principles of the instant invention provides a practical solution to the problem of avoiding thermal shock and attendant excessive strain, whereby the quality of crystal ribbon grown by edge-defined film-fed techniques is enhanced.

What is claimed is:

1. In combination with a susceptor particularly suited for use in growing edge-defined, film-fed growth techniques and characterized by a susceptor of a generally V-trough configuration, including a die through which a melt is drawn for forming a ribbon crystal and supported by a pedistal comprising a pair of horizontally oriented bars and a pair of vertically oriented posts connected in supporting relation with said bars:
   A. means for delivering a stream of fluid coolant to impinge against said susceptor in close proximity with said die in non-incident relation with a ribbon crystal being formed, including a pair of orifices disposed beneath the susceptor for directing a pair of cooling streams of inert gas in substantially vertical directions toward said susceptor;
   B. means defining in each of said vertically oriented posts a tubular bore extended axially therethrough and connected in communicating relation with one orifice of said pair; and
   C. means for continuously delivering a stream of coolant to each of said bores.

2. The combination as defined in claim 1 wherein each bar of said pair is fabricated from graphite and includes a downwardly opening socket defined therein and each post of said pair is fabricated from quartz and includes an end portion received in a downwardly facing socket defined in one bar of said pair.

3. The combination of claim 2 wherein each orifice of said pair of orifices comprises a bore extended substantially vertically through one bar of said pair.

* * * * *